US012770829B2

(12) United States Patent
Bhowmick et al.

(10) Patent No.: US 12,770,829 B2
(45) **Date of Patent: *Oct. 20, 2026**

(54) SYSTEMS AND METHODS FOR EXTRACTING PROCESS CONTROL INFORMATION FROM RADIOFREQUENCY SUPPLY SYSTEM OF PLASMA PROCESSING SYSTEM

(71) Applicant: Lam Research Corporation, Fremont, CA (US)

(72) Inventors: Ranadeep Bhowmick, San Jose, CA (US); Alexei Marakhtanov, Albany, CA (US); Felix Leib Kozakevich, Sunnyvale, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 18/928,852

(22) Filed: Oct. 28, 2024

(65) Prior Publication Data

US 2025/0054730 A1 Feb. 13, 2025

Related U.S. Application Data

(63) Continuation of application No. 18/011,830, filed as application No. PCT/US2021/039425 on Jun. 28, 2021, now Pat. No. 12,131,886.

(Continued)

(51) Int. Cl.
*H01J 37/32* (2006.01)

(52) U.S. Cl.
CPC .. *H01J 37/32183* (2013.01); *H01J 37/32091* (2013.01); *H01J 37/32119* (2013.01); *H01J 2237/3348* (2013.01)

(58) Field of Classification Search
CPC .......... H01J 37/32183; H01J 37/32091; H01J 37/32119; H01J 2237/3348; H01J 37/32155; H01J 37/32165; H01J 37/3293
See application file for complete search history.

(56) References Cited

U.S. PATENT DOCUMENTS

| | | | | |
|---|---|---|---|---|
| 9,598,771 | B2 | 3/2017 | Liu | |
| 11,574,799 | B2 * | 2/2023 | Oliveti | H01J 37/32183 |

(Continued)

FOREIGN PATENT DOCUMENTS

| | | | |
|---|---|---|---|
| EP | 3481160 | A1 | 5/2019 |
| JP | 2002-176034 | A | 6/2002 |

(Continued)

OTHER PUBLICATIONS

PCT/US2021/039425, International Search Report and Written Opinion, Mailed on Oct. 21, 2021.

*Primary Examiner* — Abdullah A Riyami
*Assistant Examiner* — Syed M Kaiser
(74) *Attorney, Agent, or Firm* — Polygon IP, LLP

(57) ABSTRACT

A first radiofrequency signal generator is set to generate a low frequency signal. A second radiofrequency signal generator is set to generate a high frequency signal. An impedance matching system has a first input connected to an output of the first radiofrequency signal generator and a second input connected to an output of the second radiofrequency signal generator. The impedance matching system controls impedances at the outputs of the first and second radiofrequency signal generators. An output of the impedance matching system is connected to a radiofrequency supply input of a plasma processing system. A control module monitors reflected voltage at the output of the second radiofrequency signal generator. The control module determines when the reflected voltage indicates a change in impedance along a transmission path of the high frequency (Continued)

signal that is indicative of a particular process condition and/or event within the plasma processing system.

17 Claims, 8 Drawing Sheets

Related U.S. Application Data

(60) Provisional application No. 63/049,471, filed on Jul. 8, 2020.

(56) References Cited

U.S. PATENT DOCUMENTS

| | | | | |
|---|---|---|---|---|
| 2007/0215282 | A1 | 9/2007 | Itabashi et al. | |
| 2014/0203821 | A1 | 7/2014 | Yamamoto et al. | |
| 2016/0260584 | A1* | 9/2016 | Marakhtanov | H01J 37/3255 |
| 2017/0062187 | A1 | 3/2017 | Radomski et al. | |
| 2017/0117869 | A1* | 4/2017 | Leeser | H01J 37/32183 |
| 2020/0150164 | A1* | 5/2020 | Ulrich | G01R 25/04 |
| 2020/0411290 | A1* | 12/2020 | Oliveti | H01J 37/32183 |

FOREIGN PATENT DOCUMENTS

| | | | |
|---|---|---|---|
| JP | 2004-119597 | A | 4/2004 |
| JP | 2007-250755 | A | 9/2007 |
| JP | 2014-142266 | A | 8/2014 |
| KR | 1020180046713 | A | 5/2018 |
| WO | 2020068107 | A1 | 4/2020 |

* cited by examiner

SYSTEMS AND METHODS FOR EXTRACTING PROCESS CONTROL INFORMATION FROM RADIOFREQUENCY SUPPLY SYSTEM OF PLASMA PROCESSING SYSTEM

CLAIM OF PRIORITY

This application is a continuation application under 35 U.S.C. 120 of prior U.S. patent application Ser. No. 18/011,830, filed on Dec. 20, 2022, which claims priority under 35 U.S.C. 371 to PCT Application No. PCT/US2021/039425, filed on Jun. 28, 2021, which claims priority under 35 U.S.C. 119(e) to U.S. Provisional Patent Application No. 63/049,471, filed on Jul. 8, 2020. The disclosure of each above-identified patent application is incorporated herein by reference in its entirety for all purposes.

BACKGROUND

1. Field of the Disclosure

The present disclosure relates to semiconductor device fabrication.

2. Description of the Related Art

In the fabrication of semiconductor devices such as integrated circuits, memory cells, and the like, a series of manufacturing operations are performed to define features on a semiconductor wafer ("wafers" hereafter). The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma and corresponding process results on the substrate are affected by many process parameters including, but not limited to, material composition of the process gas, flow rate of the process gas, geometric features of the plasma generation region and surrounding structures, temperatures of the process gas and surrounding materials, frequency of the RF power applied, magnitude of the RF power applied, and temporal manner in which the RF power is applied, among others. Therefore, it is of interest to understand, monitor, and/or control some of the process parameters that may affect the characteristics of the generated plasma and corresponding process results on the substrate. It is within this context that the present disclosure arises.

SUMMARY

In an example embodiment, a radiofrequency signal generator system for a plasma processing system is disclosed.

The radiofrequency signal generator system includes a first radiofrequency signal generator set to generate a low frequency signal at an output of the first radiofrequency signal generator. The radiofrequency signal generator system also includes a second radiofrequency signal generator set to generate a high frequency signal at an output of the second radiofrequency signal generator. The radiofrequency signal generator system also includes an impedance matching system that has a first input connected to the output of the first radiofrequency signal generator and a second input connected to the output of the second radiofrequency signal generator. The impedance matching system has an output connected to a radiofrequency supply input of the plasma processing system. The impedance matching system is configured to control impedances at the output of the first radiofrequency signal generator and at the output of the second radiofrequency signal generator. The radiofrequency signal generator system also includes a control module programmed to monitor a reflected voltage at the output of the second radiofrequency signal generator. The control module is programmed to determine when the reflected voltage at the output of the second radiofrequency signal generator indicates a change in impedance along a transmission path of the high frequency signal, where the change in impedance is indicative of a corresponding process condition and/or event within the plasma processing system.

In an example embodiment, a method is disclosed for operating a radiofrequency signal generator system for a plasma processing system. The method includes operating a first radiofrequency signal generator to generate a low frequency signal at an output of the first radiofrequency signal generator. The method also includes operating a second radiofrequency signal generator to generate a high frequency signal at an output of the second radiofrequency signal generator. The method also includes operating an impedance matching system to control impedances at the output of the first radiofrequency signal generator and at the output of the second radiofrequency signal generator. The low frequency signal and the high frequency signal are transmitted through the impedance matching system to a radiofrequency supply input of the plasma processing system causing generation of a plasma within the plasma processing system. The method also includes operating a control module to monitor a reflected voltage at the output of the second radiofrequency signal generator. The method also includes operating the control module to determine when the reflected voltage at the output of the second radiofrequency signal generator indicates a change in impedance along a transmission path of the high frequency signal that is indicative of a particular process condition and/or event within the plasma processing system.

Other aspects and advantages of the invention will become more apparent from the following detailed description, taken in conjunction with the accompanying drawings, illustrating by way of example the present invention.

DETAILED DESCRIPTION

Figure 1A:
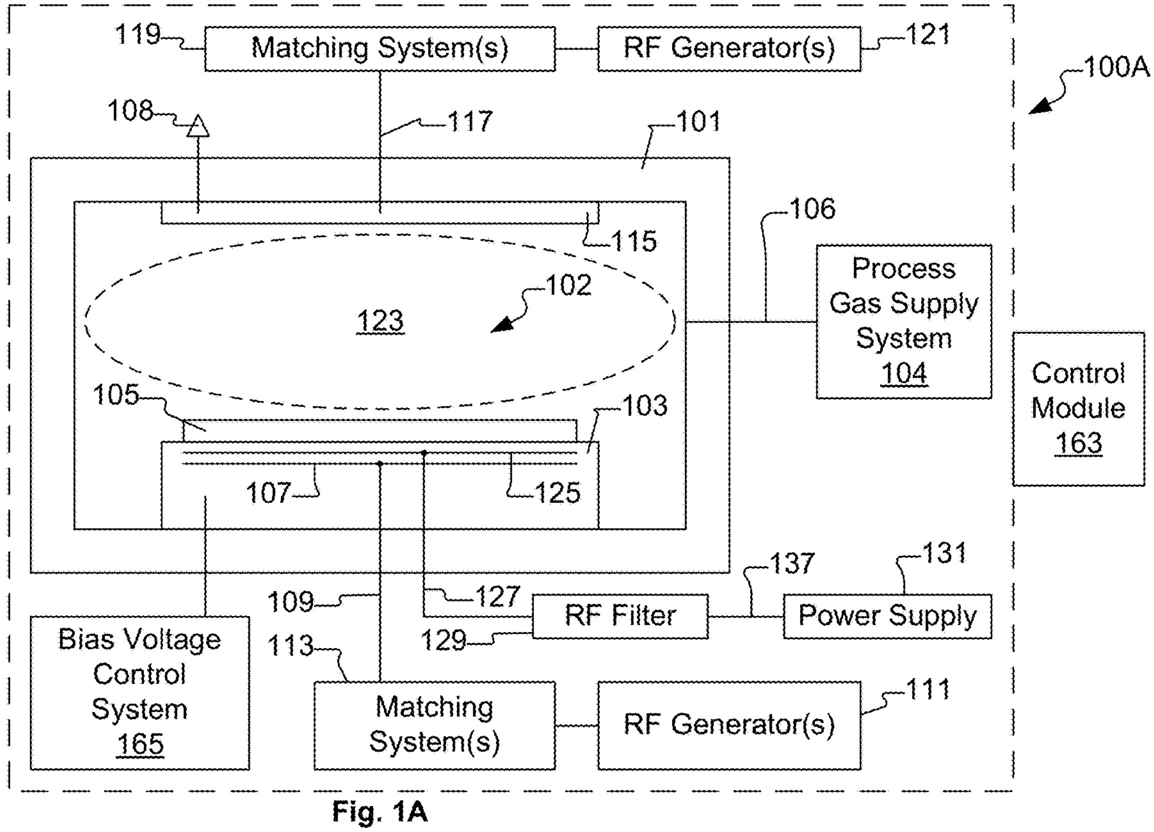
FIG. 1A shows an example vertical cross-section diagram of a CCP processing system, in accordance with some embodiments of the present disclosure.

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

In the semiconductor industry, semiconductor substrates can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the substrate is exposed. Reactive species and/or charged species within the plasma interact with the substrate to modify a condition of the substrate, such as by modifying a material present on the substrate, or by depositing material on the substrate, or by removing/etching material from the substrate, by way of example. The CCP and ICP processing chambers can be equipped with one or more electrodes that receive RF power for generating the plasma within the plasma processing region. Also, the CCP and ICP processing chambers can be equipped with one or more electrodes that receive RF power and/or direct current (DC) power to generate a bias voltage at the substrate location for attracting charged species from the plasma toward the substrate. Also, in some embodiments, the CCP and ICP processing chambers can be equipped with one or more electrically powered components, such as a heater assembly, that receive electrical power from one or more power supplies, where each of the one or more power supplies is either a DC power supply or an AC (alternating current) power supply.

In some embodiments, RF signals and/or electrical (non-RF) signals present on RF electrical transmission paths connected to the CCP and/or ICP processing chamber(s) can provide an indication of how much RF power is actually being transmitted to the plasma load within the CCP and/or ICP processing chamber(s). Also, in some embodiments, RF signals and/or electrical (non-RF) signals present at the output of the RF signal generator can provide an indication of how much RF power is being reflected from a plasma load. It is of interest to minimize the amount RF power that is reflected from the plasma load. Additionally, changes in the RF power that is reflected from the plasma load can provide information about changes in an impedance of the plasma and/or changes in other impedances along the RF signal transmission paths. Changes in the impedance of the plasma load can be indicative of changes in a composition of the plasma, which can in turn be indicative of changes in a condition of a substrate undergoing processing by the plasma. Systems and methods are disclosed herein for monitoring reflected RF power at the output of the RF generator to obtain information about changes in impedance of the plasma and/or changes in other impedances along the RF signal transmission paths that can be used as meaningful indicators of process conditions and/or events.

In various embodiments, the RF signals and/or electrical (non-RF) signals present on RF electrical transmission paths connected to the CCP and/or ICP processing chambers can be measured directly, or can be calculated, or can be used to calculate values of other parameters that provide an indication of how much RF power is actually being transmitted to the plasma load within the CCP and/or ICP processing chamber(s) and how much RF power is being reflected by the plasma load. It is desirable to maximize the amount of forward RF power that is actually transmitted to the plasma load within the CCP and/or ICP processing chamber(s), and to minimize the amount of reflected RF power that is seen at the output of the RF signal generator.

FIG. 1A shows an example vertical cross-section diagram of a CCP processing system 100A, in accordance with some embodiments of the present disclosure. The CCP processing system 100A includes a chamber 101 within which a plasma processing region 102 exists. Within the plasma processing region 102, a plasma 123 (represented by the dashed oval region) is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, the substrate 105 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) diameter semiconductor wafer, a 300 mm diameter semiconductor wafer, or a 450 mm diameter semiconductor wafer, among other semiconductor wafer sizes. Also, in some embodiments, the substrate 105 referred to herein may correspond to a non-circular substrate, such as a rectangular substrate for a flat panel display, or the like, among other shapes.

The plasma processing region 102 within the CCP processing chamber 101 is connected to a process gas supply system 104, such that one or more process gas(es) can be supplied in a controlled manner to the plasma processing region 102, as represented by line 106. It should be understood that the process gas supply system 104 includes one or more process gas sources and an arrangement of valves and mass flow controllers to enable provision of the one or more process gas(es) to the plasma processing region 102 with a controlled flow rate and with a controlled flow time. Also, in various embodiments, the one or more process gas(es) are delivered to the plasma processing region 102 in both a temporally controlled manner and a spatially controlled manner relative to the substrate 105. In various embodiments, the CCP processing system 100A operates by having the process gas supply system 104 deliver one or more process gases into the plasma processing region 102, and by applying RF power to the one or more process gases to transform the one or more process gases into the plasma 123 in exposure to the substrate 105, in order to cause a change in material or surface condition on the substrate 105.

The CCP processing chamber 101 includes a substrate support structure 103 upon which the substrate 105 is positioned and supported during processing operations. In some embodiments, an electrode 107 is disposed within the substrate support structure 103 to provide for transmission of RF power from the electrode 107 through the plasma processing region 102 to generate the plasma 123 and/or control ion energy. The electrode 107 is connected to receive RF power through an RF feed structure 109, which is connected to one or more RF power generator(s) 111 by way of one or more impedance matching system(s) 113. The RF feed structure 109 is an electrically conductive member. In some embodiments, the RF feed structure 109 includes an electrically conductive rod. The impedance matching system (s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the plasma processing region 102 as efficiently as possible, e.g., with minimum possible reflection.

Also, in some embodiments, the CCP processing chamber 101 can include an upper electrode 115. In various embodiments, the upper electrode 115 can provide either an electrical ground electrode or can be used to transmit RF power into the plasma processing region 102. For example, in some embodiments, the upper electrode 115 is connected to a reference ground potential 108, such that the upper electrode 115 provides a return path for RF signals transmitted into the plasma processing region 102 from the electrode 107. Alternatively, in some embodiments, the upper electrode 115 is connected to receive RF power through an RF feed structure 117, which is connected to one or more RF power generator (s) 121 by way of one or more impedance matching system (s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the plasma processing region 102 in as efficiently as possible, e.g., with minimum possible reflection.

In some embodiments, a heater assembly 125 is disposed within the substrate support structure 103 to provide temperature control of the substrate 105. The heater assembly 125 is electrically connected to receive electrical power through an electrical connection 127, where the electrical power is supplied from a power supply 131 through an electrical connection 137 to an RF filter 129, and through the RF filter 129 to the electrical connection 127. In some embodiments, the power supply 131 is an alternating current (AC) power supply. In some embodiments, the power supply 131 is a direct current (DC) power supply. In some embodiments, the heater assembly 125 includes a plurality of electrical resistance heating elements. The RF filter 129 is configured to prevent RF power from entering the power supply 131, while allowing transmission of electrical current between the power supply 131 and the electrical connection 127.

Also, in some embodiments, a bias voltage control system 165 is connected to the substrate support structure 103 within the CCP processing chamber 101. In some embodiments, the bias voltage control system 165 is connected to one or more bias voltage electrodes disposed within the substrate support structure 103 to control a bias voltage present at the location of the substrate 105. The bias voltage can be controlled to attract charged constituents of the plasma 123 toward the substrate 105 and thereby control energy and directionality of the charged constituents of the plasma 123. For example, the bias voltage control system 165 can be operated to accelerate ions in the plasma 123 toward the substrate 105 to perform an anisotropic etch on the substrate 105.

Figure 1B:
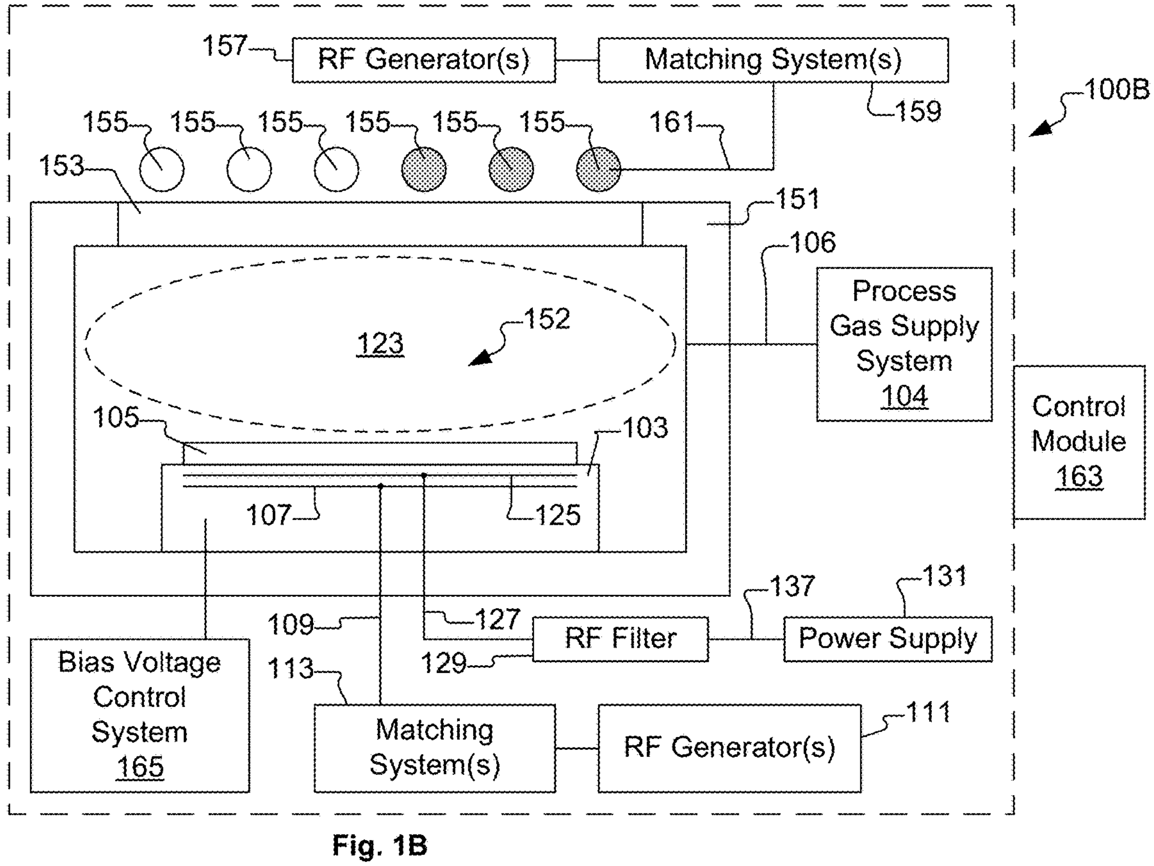
FIG. 1B shows an example vertical cross-section diagram of an ICP processing system, in accordance with some embodiments of the present disclosure.

FIG. 1B shows an example vertical cross-section diagram of an ICP processing system 100B, in accordance with some embodiments of the present disclosure. The ICP processing system 100B can also be referred to as a transformer coupled plasma (TCP) processing system. For ease of discussion herein, ICP processing system will be used to refer to both ICP and TCP processing systems. The ICP processing system 100B includes a chamber 151 within which a plasma processing region 152 exists. Within the plasma processing region 152, the plasma 123 (represented by the dashed oval region) is generated in exposure to the substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. It should be understood that the ICP processing chamber 151 can be any type of ICP processing chamber in which RF power is transmitted from a coil 155 disposed outside the ICP processing chamber 151 to a process gas within the ICP processing chamber 151 to generate the plasma 123 within the plasma processing region 152. An upper window structure 153 is provided to allow for transmission of RF power from the coil 155 through the upper window structure 153 and into the plasma processing region 152 of the ICP processing chamber 151.

The plasma processing region 152 within the ICP processing chamber 151 is connected to the process gas supply system 104, such that one or more process gas(es) can be supplied in a controlled manner to the plasma processing region 152, as represented by line 106. The ICP processing system 100B operates by having the process gas supply system 104 flow one or more process gases into the plasma processing region 152, and by applying RF power from the coil 155 to the one or more process gases to transform the one or more process gases into the plasma 123 in exposure to the substrate 105, in order to cause a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing region 152. In various embodiments, the coil 155 can have any number of turns and any cross-section size and shape (circular, oval, rectangular, trapezoidal, etc.) as appropriate to provide the desired transmission of RF power through the upper window structure 153 into the plasma processing region 152.

The coil 155 is connected through an RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the plasma processing region 152 in as efficiently as possible, i.e., with minimum possible reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the heater assembly 125 disposed within the substrate support structure 103 to provide temperature control of the substrate 105. As described with regard to the CCP processing chamber 101 of FIG. 1A, the heater assembly 125 of the ICP processing chamber 151 is electrically connected to receive electrical power through the electrical connection 127, where the electrical power is supplied from the power supply 131 through the electrical connection 137 to the RF filter 129, and through the RF filter 129 to the electrical connection 127. Also, in some embodiments, the bias voltage control system 165 is connected to the substrate support structure 103 within the ICP processing chamber 151.

A control module 163 is configured and connected to provide for control of plasma process operations performed by the CCP processing system 100A and by the ICP processing system 100B. In some embodiments, the control module 163 is implemented as a combination of computer hardware and software. The control module 163 can be configured and connected to provide for control of essentially any system or component associated with the CCP processing system 100A and/or the ICP processing system 100B. For example, the control module 163 can be configured and connected to control the process gas supply system 104, the RF signal generator(s) 111, the impedance matching system(s) 113, the RF signal generator(s) 121, the impedance matching system(s) 119, the power supply 131 for the heater assembly 125, the bias voltage control system 165, the RF signal generator(s) 157, the impedance matching system(s) 159, and/or any other system or component.

Also, the control module 163 can be connected and configured to receive signals from various components, sensors, and monitoring devices associated with the CCP processing system 100A and the ICP processing system 100B. For example, the control module 163 can be connected and configured to receive electrical measurement signals, e.g., voltage and/or current, and RF measurement signals from one or more of the substrate support structure 103, the RF feed structure 109, the RF feed structure 117, the RF feed structure 161, the electrical connection 127, and from any other structure or component within the CCP processing system 100A and the ICP processing system 100B. And, the control module 163 can be connected and configured to receive temperature and pressure measurement signals from within the plasma processing regions 102 and 152 of the CCP processing chamber 101 and the ICP processing chamber 151, respectively. Also, in some embodiments, the control module 163 can be configured and connected to receive, process, and respond to an optically measured signal within the CCP processing chamber 101 and the ICP processing chamber 151.

It should be understood that the control module 163 can be connected and configured to control essentially any active device, i.e., controllable device, associated with operation of the CCP processing system 100A and the ICP processing system 100B. And, it should be understood that the control module 163 can be connected and configured to monitor essentially any physical and/or electrical state, condition, and/or parameter at essentially any location within the CCP processing system 100A and the ICP processing system 100B. The control module 163 can also be configured to direct operation of various components in a synchronous and scheduled manner to perform a prescribed plasma processing operation on the substrate 105. For example, the control module 163 can be configured to operate the CCP processing system 100A and the ICP processing system 100B by executing process input and control instructions/programs. The process input and control instructions/programs may include process recipes having time-dependent directions for parameters such as power levels, timing parameters, process gases, mechanical movement of the substrate 101, etc., as needed to obtain a desired process result on the substrate 105.

Figure 1C:
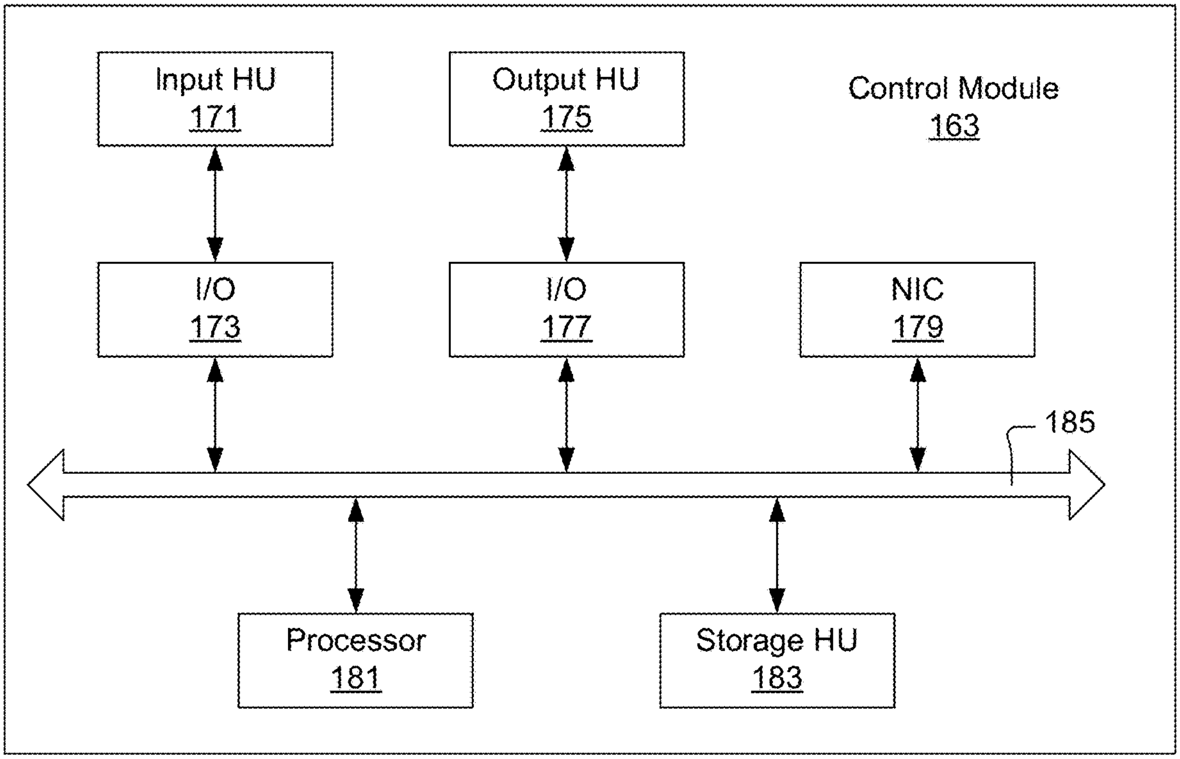
FIG. 1C shows a diagram of a control module, in accordance with some example embodiments.

FIG. 1C shows a diagram of the control module 163, in accordance with some example embodiments. The control module 163 includes a processor 181, a storage hardware unit (HU) 183 (e.g., memory), an input HU 171, an output HU 175, an input/output (I/O) interface 173, an I/O interface 177, a network interface controller (NIC) 179, and a data communication bus 185. The processor 181, the storage HU 183, the input HU 171, the output HU 175, the I/O interface 173, the I/O interface 177, and the NIC 179 are in data communication with each other by way of the data communication bus 185. Examples of the input HU 171 include a mouse, a keyboard, a stylus, a data acquisition system, a data acquisition card, etc. Examples of the output HU 175 include a display, a speaker, a device controller, etc. Examples of the NIC 179 include a network interface card, a network adapter, etc. In various embodiments, the NIC 179 is configured to operate in accordance with one or more communication protocols and associate physical layers, such as Ethernet and/or EtherCAT, among others. Each of the I/O interfaces 173 and 177 is defined to provide compatibility between different hardware units coupled to the I/O interface. For example, the I/O interface 173 can be defined to convert a signal received from the input HU 171 into a form, amplitude, and/or speed compatible with the data communication bus 185. Also, the I/O interface 177 can be defined to convert a signal received from the data communication bus 185 into a form, amplitude, and/or speed compatible with the output HU 175. Although various operations described herein are performed by the processor 181 of the control module 163, it should be understood that in some embodiments various operations can be performed by multiple processors of the control module 163 and/or by multiple processors of multiple computing systems connected to the control module 163.

Figure 2:
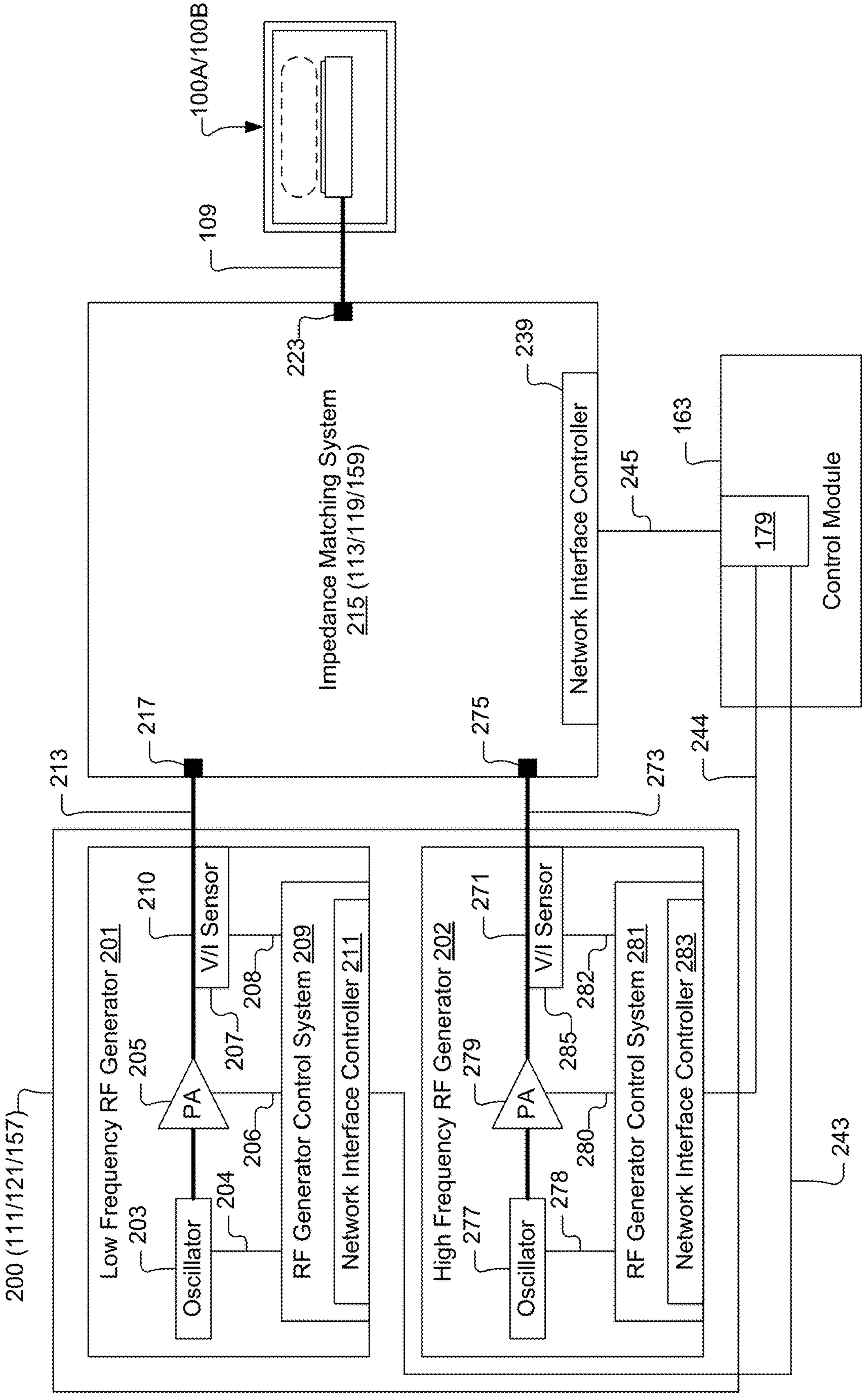
FIG. 2 shows an RF signal generator system that includes a low frequency RF signal generator and a high frequency RF signal generator, in accordance with some embodiments

FIG. 2 shows an RF signal generator system 200 that includes a low frequency RF signal generator 201 and a high frequency RF signal generator 202, in accordance with some embodiments. Each of the low frequency RF signal generator 201 and the high frequency RF signal generator 202 is connected to supply RF signals through an impedance matching system 215 to the CCP/ICP processing system 100A/100B. For ease of description, the CCP/ICP processing system 100A/100B is referred to hereafter as a plasma processing system 100A/100B. In various embodiments, the RF signal generator system 200 represents any one or more of the RF signal generators 111, 121, and 157, as described with regard to FIGS. 1A-1B. Also, the impedance matching system 215 represents each of the impedance matching systems 113, 119, and 159, as described with regard to FIGS. 1A-1B.

The low frequency RF signal generator 201 is configured to generate and transmit low frequency RF signals of controlled amplitude and frequency from an output 210 of the low frequency RF signal generator 201, through/along an electrical conductor 213, to an input 217 of the impedance matching system 215. The low frequency RF signals then travel from an output 223 of the impedance matching system 215, through/along the RF feed structure 109, to an electrode (e.g., 107, 115, 155) within the plasma processing system 100A/100B. In the case of the CCP processing system 100A, the low frequency RF signals travel through the plasma processing region 102 to generate the plasma 123. In the case of the ICP processing system 100B, the low frequency RF signals travel through the plasma processing region 152 to generate the plasma 123.

Similarly, the high frequency RF signal generator 202 is configured to generate and transmit high frequency RF signals of controlled amplitude and frequency from an output 271 of the high frequency RF signal generator 202, through/along an electrical conductor 273, to an input 275 of the impedance matching system 215. The high frequency RF signals then travel from the output 223 of the impedance matching system 215, through/along the RF feed structure 109, to an electrode (e.g., 107, 115, 155) within the plasma processing system 100A/100B. In the case of the CCP processing system 100A, the high frequency RF signals travel through the plasma processing region 102 to generate the plasma 123. In the case of the ICP processing system 100B, the high frequency RF signals travel through the plasma processing region 152 to generate the plasma 123.

The impedance matching system 215 includes a combination of capacitors and inductors configured and connected in an electrical circuit to match an impedance at the output 210 of the low frequency RF signal generator 201 to a design impedance (usually 50 Ohms). The impedance matching system 215 also includes a combination of capacitors and inductors configured and connected in an electrical circuit to match an impedance at the output 271 of the high frequency RF signal generator 202 to a design impedance (usually 50 Ohms). The impedance matching system 215 also includes a network interface controller 239 that enables the impedance matching system 215 to send data to and receive data from systems outside of the impedance matching system 215. Examples of the network interface controller 239 include a network interface card, a network adapter, etc. In various embodiments, the network interface controller 239 is configured to operate in accordance with one or more network communication protocols and associate physical layers, such as Ethernet and/or EtherCAT, among others.

The low frequency RF signal generator 201 includes an oscillator 203 for generating RF signals. The oscillator 203 is an electronic circuit that produces a periodic oscillating electrical signal, such a sine wave electrical signal, having a specified frequency within the RF range. In some embodiments, the oscillator 203 is a low-frequency oscillator capable of oscillating within a frequency range extending from about 50 kiloHertz (kHz) to about 3 megaHertz (MHz). In some embodiments, the oscillator 203 is set to generate low frequency RF signals of about 400 kHz. An output of the oscillator 203 is connected to an input of a power amplifier 205. The power amplifier 205 operates to amplify the low frequency RF signals generated by the oscillator 203, and transmit the amplified low frequency RF signals through an output of the power amplifier 205 to the output 210 of the low frequency RF signal generator 201.

The low frequency RF signal generator 201 also includes a control system 209 configured to provide for control of all operational aspects of the low frequency RF signal generator 201. In some embodiments, the control system 209 is configured in a similar manner as the control module 163 of the plasma processing system 100A/100B. For example, in some embodiments, the control system 209 includes a processor, a data storage device, an input/output interface, and a data bus through which the processor, the data storage device, and the input/output interface communicate data to and from each other. The control system 209 is connected to provide for control of the oscillator 203, as indicated by connection 204. The control system 209 is also connected to provide for control of the power amplifier 205, as indicated by connection 206. The control system 209 also includes a network interface controller 211 that enables the control system 209 to send data to and receive data from systems outside of the low frequency RF signal generator 201. Examples of the network interface controller 211 include a network interface card, a network adapter, etc. In various embodiments, the network interface controller 211 is configured to operate in accordance with one or more network communication protocols and associate physical layers, such as Ethernet and/or EtherCAT, among others.

It should be understood that the control system 209 is connected and configured to control essentially any aspect of the low frequency RF signal generator 201. And, it should be understood that the control system 209 can be connected and configured to monitor essentially any physical and/or electrical state, condition, and/or parameter at essentially any location within the low frequency RF signal generator 201. The control system 209 is also configured to direct operation of the low frequency RF signal generator 201 in accordance with a prescribed algorithm. For example, the control system 209 is configured to operate the low frequency RF signal generator 201 by executing input and control instructions/programs. The input and control instructions/programs include a target RF power setpoint and a target frequency setpoint, among other parameters associated with operation and control of the low frequency RF signal generator 201.

The low frequency RF signal generator 201 also includes a voltage/current (V/I) sensor 207 connected to the output 210 of the low frequency RF signal generator 201. The V/I sensor 207 is connected to the control system 209, as shown by connection 208. In this configuration, the V/I sensor 207 provides a real-time measurement of voltage and current present on the output 210 of the low frequency RF signal generator 201 to the control system 209. It should be understood that the V/I sensor 207 is disposed within the low frequency RF signal generator 201.

The high frequency RF signal generator 202 includes an oscillator 277 for generating RF signals. The oscillator 277 is an electronic circuit that produces a periodic oscillating electrical signal, such a sine wave electrical signal, having a specified frequency within the RF range. In some embodiments, the oscillator 277 is a high-frequency oscillator capable of oscillating within a frequency range extending from about 10 MHz to about 130 MHz. In some embodiments, the oscillator 277 is set to generate high frequency RF signals of about 60 MHz. An output of the oscillator 277 is connected to an input of a power amplifier 279. The power amplifier 279 operates to amplify the high frequency RF signals generated by the oscillator 277, and transmit the amplified high frequency RF signals through an output of the power amplifier 279 to the output 271 of the high frequency RF signal generator 202.

The high frequency RF signal generator 202 also includes a control system 281 configured to provide for control of all operational aspects of the high frequency RF signal generator 202. In some embodiments, the control system 281 is configured in a similar manner as the control module 163 of the plasma processing system 100A/100B. For example, in some embodiments, the control system 281 includes a processor, a data storage device, an input/output interface, and a data bus through which the processor, the data storage device, and the input/output interface communicate data to and from each other. The control system 281 is connected to provide for control of the oscillator 277, as indicated by connection 278. The control system 281 is also connected to provide for control of the power amplifier 279, as indicated by connection 280. The control system 281 also includes a network interface controller 283 that enables the control system 281 to send data to and receive data from systems outside of the high frequency RF signal generator 202. Examples of the network interface controller 283 include a network interface card, a network adapter, etc. In various embodiments, the network interface controller 283 is configured to operate in accordance with one or more network communication protocols and associate physical layers, such as Ethernet and/or EtherCAT, among others.

It should be understood that the control system 281 is connected and configured to control essentially any aspect of the high frequency RF signal generator 202. And, it should be understood that the control system 281 can be connected and configured to monitor essentially any physical and/or electrical state, condition, and/or parameter at essentially any location within the high frequency RF signal generator 202. The control system 281 is also configured to direct operation of the high frequency RF signal generator 202 in accordance with a prescribed algorithm. For example, the control system 281 is configured to operate the high frequency RF signal generator 202 by executing input and control instructions/programs. The input and control instructions/programs include a target RF power setpoint and a target frequency setpoint, among other parameters associated with operation and control of the high frequency RF signal generator 202.

The high frequency RF signal generator 202 also includes a voltage/current (V/I) sensor 285 connected to the output 271 of the high frequency RF signal generator 202. The V/I sensor 285 is connected to the control system 281, as shown by connection 282. In this configuration, the V/I sensor 285 provides a real-time measurement of voltage and current present on the output 271 of the high frequency RF signal generator 202 to the control system 281. It should be understood that the V/I sensor 285 is disposed within the high frequency RF signal generator 202.

In some embodiments, the control system 209 of the low frequency RF signal generator 201 is programmed to determine a real-time reflection coefficient (or Gamma (Γ)) at the output 210 of the low frequency RF signal generator 201, where $\Gamma=V_r/V_f$, with $V_r$ being the complex amplitude of the reflected RF signal, and with $V_f$ being the complex amplitude of the forward RF signal. Also, in some embodiments, the control system 209 of the low frequency RF signal generator 201 is also programmed to determine a voltage standing wave ratio (VSWR) at the output 210 of the low frequency RF signal generator 201, where $VSWR=|V_{max}|/|V_{min}|=(1+|\Gamma|)/(1-|\Gamma|)$, with $|V_{max}|=|V_f|+|V_r|$ and $|V_{min}|=|V_f|-|V_r|$. Minimization of the reflected RF power associated with the low frequency RF signal generated by the low frequency RF signal generator 201 occurs when the reflection coefficient at the output 210 of the low frequency RF signal generator 201 is as close to zero as possible. Also, minimization of the reflected RF power associated with the low frequency RF signal generated by the low frequency RF signal generator 201 occurs when the VSWR at the output 210 of the low frequency RF signal generator 201 is as close to one as possible, where one is the minimum possible value of VSWR. In some embodiments, the control system 209 is programmed to use the real-time measured voltage on the output 210 of the low frequency RF signal generator 201 to calculate the real-time reflection coefficient and/or VSWR at the output 210 of the low frequency RF signal generator 201. The real-time reflection coefficient and/or VSWR at the output 210 of the low frequency RF signal generator 201, as determined using voltage measurements taken within the low frequency RF signal generator 201, can be used as a feedback signal to minimize the reflection coefficient to as close to zero as possible and/or to minimize the VSWR to as close to one as possible.

Similarly, in some embodiments, the control system 281 of the high frequency RF signal generator 202 is programmed to determine the reflection coefficient (or Gamma (Γ)) and VSWR at the output 271 of the high frequency RF signal generator 202. Minimization of the reflected RF power associated with the high frequency RF signal generated by the high frequency RF signal generator 202 occurs when the reflection coefficient at the output 271 of the high frequency RF signal generator 202 is as close to zero as possible. Also, minimization of the reflected RF power associated with the high frequency RF signal generated by the high frequency RF signal generator 202 occurs when the VSWR at the output 271 of the high frequency RF signal generator 202 is as close to one as possible, where one is the minimum possible value of VSWR. In some embodiments, the control system 281 is programmed to use the real-time measured voltage on the output 271 of the high frequency RF signal generator 202 to calculate the real-time reflection coefficient and/or VSWR at the output 271 of the high frequency RF signal generator 202. The real-time reflection coefficient and/or VSWR at the output 271 of the high frequency RF signal generator 202, as determined using voltage measurements taken within the high frequency RF signal generator 202, can be used as a feedback signal to minimize the reflection coefficient to as close to zero as possible and/or to minimize the VSWR to as close to one as possible at the output 271 of the high frequency RF signal generator 202. Also, the real-time reflection coefficient and/or VSWR at the output 271 of the high frequency RF signal generator 202, as determined using voltage measurements taken within the high frequency RF signal generator 202, can be used to determine a reflected RF power at the output of the 271 of the high frequency RF signal generator 202.

The control module 163 is connected to the control system 209 of the low frequency RF signal generator 201, by way of NIC 179 and NIC 211, as indicated by connection 243. The control module 163 is connected to the control system 281 of the high frequency RF signal generator 202, by way of NIC 179 and NIC 283, as indicated by connection 244. The control module 163 is connected to the impedance matching system 215, by way of NIC 179 and NIC 239, as indicated by connection 245. In some embodiments, the control module 163 is programmed to direct operation of the low frequency RF signal generator 201 and the high frequency RF signal generator 202 in accordance with a frequency tuning process. The frequency tuning process automatically adjusts an operating frequency of the low frequency RF signal generator 201 about a target frequency of the low frequency signal to minimize reflected voltage at the output 210 of the low frequency RF signal generator 201. Also, in the frequency tuning process, an operating frequency of the high frequency RF signal generator 202 is automatically adjusted about a target frequency of the high frequency signal to minimize reflected voltage at the output 271 of the high frequency RF signal generator 202. In the frequency tuning process, the operating frequency of the high frequency RF signal generator 202 is separately adjusted about the target frequency of the high frequency signal in each of a plurality of temporal bins that collectively span a complete cycle of the low frequency signal generated by the low frequency RF signal generator 201, with the plurality of temporal bins and corresponding separate operating frequency adjustments (of the high frequency RF signal generator 202) repeating in sequence over each cycle of the low frequency signal generated by the low frequency RF signal generator 201.

Figure 3:
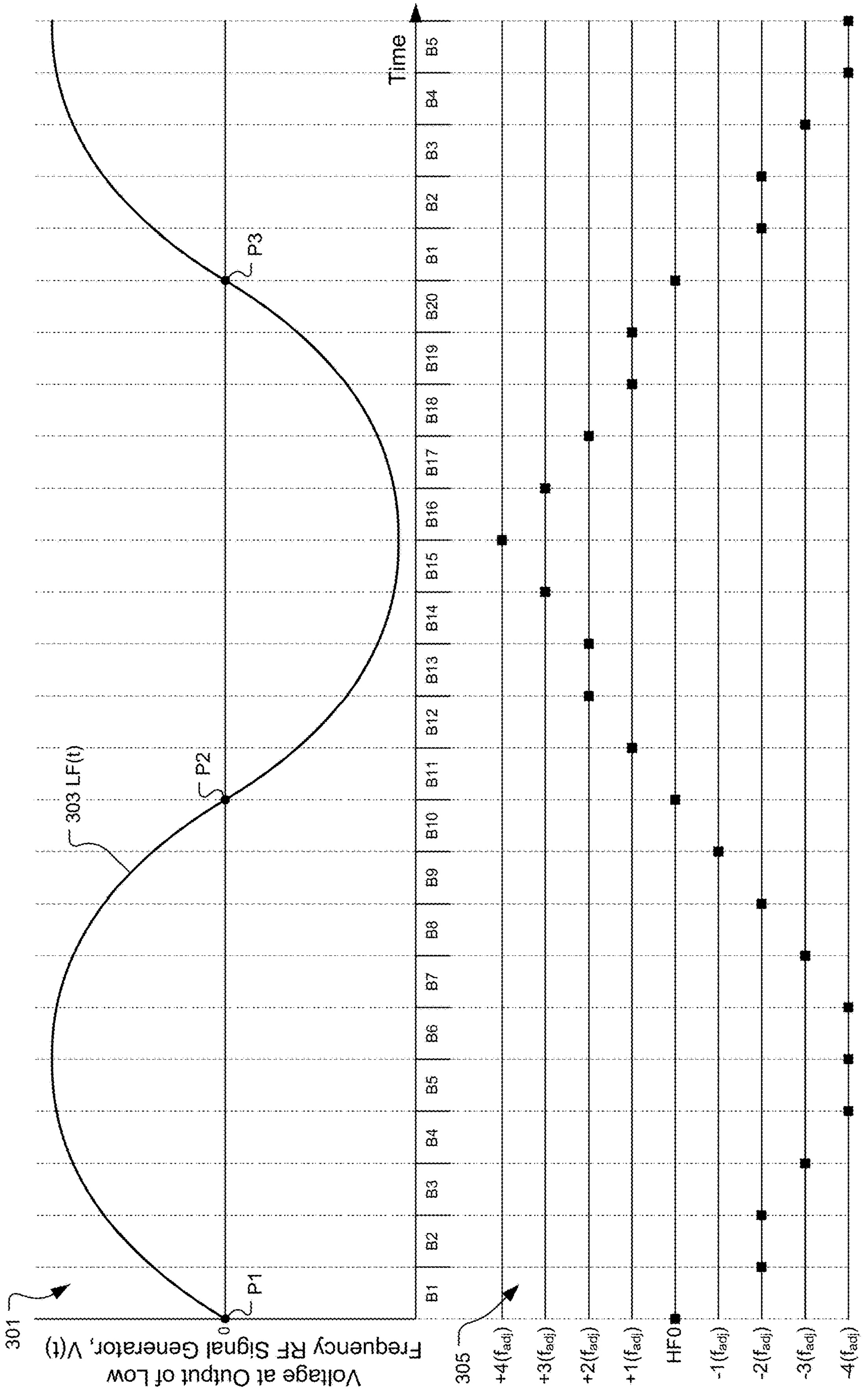
FIG. 3 shows a diagram of a frequency tuning process, in accordance with some embodiments.

FIG. 3 shows a diagram of the frequency tuning process, in accordance with some embodiments. An upper plot 301 shows a curve 303 of voltage measured as a function of time at the output 210 of the low frequency RF signal generator 201. The curve 303 represents that low frequency signal generated by the low frequency RF signal generator 201. The low frequency signal is a sinusoidal signal characterized by a repeating cycle. In the upper plot 301, a given cycle of the low frequency signal begins at a point P1 and ends at a point P3, with a point P2 marking the half-cycle location. In the example of FIG. 3, the cycle of the low frequency signal begins where the low frequency signal crosses the zero voltage level in the positive direction. This beginning location of the cycle of the low frequency signal is referred to herein as the positive direction zero voltage crossing of the low frequency signal. The half-cycle location occurs where the low frequency signal crosses the zero voltage level in the negative direction. And, the cycle of the low frequency signal ends where the low frequency signal again crosses the zero voltage level in the positive direction. The cycle of the low frequency signal is divided into a plurality of temporal bins B1 through B(N), where N is the total number of temporal bins. The example of FIG. 3 shows the cycle of the low frequency signal is divided into 20 (N=20) temporal bins B1 through B20. The first temporal bin B1 of the plurality of temporal bins B1 through B(N) begins at a positive direction zero voltage crossing of the complete cycle of the low frequency signal. The last temporal bin B(N) of the plurality of temporal bins B1 through B(N) ends at the next positive direction zero voltage crossing of the complete cycle of the low frequency signal.

It should be understood that the 20 temporal bins (N=20) of FIG. 3 is shown by way of example. In other embodiments, the plurality of temporal bins B1 through B(N) can have N set at either less than 20 or greater than 20. Also, the example of FIG. 3 shows that each of the plurality of temporal bins B1 through B(N) covers an equal amount of time. However, in other embodiments, different ones of the plurality of temporal bins B1 through B(N) can be defined to cover different amounts of time. For example, if a higher resolution of adjustment in the frequency of the high frequency signal, as generated by the high frequency RF signal generator 202, is required along a particular portion of the cycle of the low frequency signal, as generated by the low frequency RF signal generator 201, some of the plurality of temporal bins B1 through B(N) along the particular portion of the cycle of the low frequency signal are respectively defined to cover a smaller amount of time.

FIG. 3 also includes a lower plot 305 that shows adjustments of the operating frequency of the high frequency RF signal generator 202 at each of the plurality of temporal bins B1 through B20 that collectively span the complete cycle of the low frequency signal generated by the low frequency RF signal generator 201. The operating frequency of the high frequency RF signal generator 202 is set at an adjusted frequency during each of the plurality of temporal bins B1 through B20. The adjusted operating frequency of the high frequency RF signal generator 202 in any given one of the plurality of temporal bins B1 through B(N) is independently and separately set relative to others of the plurality of temporal bins B1 through B(N). In some embodiments, the adjusted frequency of a given one of the plurality of temporal bins B1 through B(N) is an integer multiple of a frequency adjustment amount ($f_{adj}$) about a target frequency (HF0) of the high frequency signal generated by the high frequency RF signal generator 202. For example, FIG. 3 shows a line corresponding to the target frequency (HF0) of the high frequency signal generated by the high frequency RF signal generator 202. FIG. 3 also shows lines for each of the integer multiples of the frequency adjustment amount ($f_{adj}$), respectively. As shown in FIG. 3, the adjusted frequency of a given one of the plurality of temporal bins B1 through B20 is an integer multiple of the frequency adjustment amount ($f_{adj}$) about the target frequency (HF0). In some embodiments, the integer multiple is either −4, −3, −2, −1, 0, +1, +2, +3, +4. However, in other embodiments, integer multiples less than −4 and/or greater than +4 can be used. Also, in some embodiments, the integer multiple is replaced by a fractional multiple. Also, in some embodiments, the frequency adjustment amount ($f_{adj}$) is set as the target frequency of the low frequency signal as generated by the low frequency RF signal generator 201. In the example of FIG. 3, if the target frequency of the low frequency signal as generated by the low frequency RF signal generator 201 is 400 kHz, then the bin-level operating frequency of the high frequency RF signal generator 202 at −4($f_{adj}$) is HF0−1600 kHz, and at −3($f_{adj}$) is HF0−1200 kHz, an at −2($f_{adj}$) is HF0−800 kHz, and at −1($f_{adj}$) is HF0−400 kHz, and at 0($f_{adj}$) is HF0, and at +1($f_{adj}$) is HF0+400 kHz, and at +2($f_{adj}$) is HF0+800 kHz, and at +3($f_{adj}$) is HF0+1200 kHz, and at +4 ($f_{adj}$) is HF0+1600 kHz. The operating frequency of the high frequency RF signal generator 202 for a given one the plurality of temporal bins B1 through B(N), e.g., the setting of integer multiple of the frequency adjustment amount ($f_{adj}$) for the given one of the plurality of temporal bins B1 through B(N), is determined empirically as the frequency adjustment that minimizes the reflected RF power at the output 271 of the high frequency RF signal generator 202 during the given one of the plurality of temporal bins B1 through B(N). Also, in some embodiments, the frequency adjustment amount ($f_{adj}$) is set at a determined amount of frequency that is different than the target frequency of the low frequency signal as generated by the low frequency RF signal generator 201.

The adjusted frequencies of the high frequency RF signal generator 202 across the plurality of temporal bins B1 through B(N) are repeated for each cycle of the low frequency signal generated by the low frequency RF signal generator 201. Periodically, the frequency tuning process will re-tune (re-determine) the adjusted frequencies of the high frequency RF signal generator 202 for the plurality of temporal bins B1 through B(N) to ensure that the reflected RF power at the output 271 of the high frequency RF signal generator 202 is minimized to the extent possible. In some embodiments, the frequency tuning process is implemented by programming the control module 163, which in turn directs operation of the control system 209 within the low frequency RF signal generator 201 and operation of the control system 281 within the high frequency RF signal generator 202.

Figure 4:
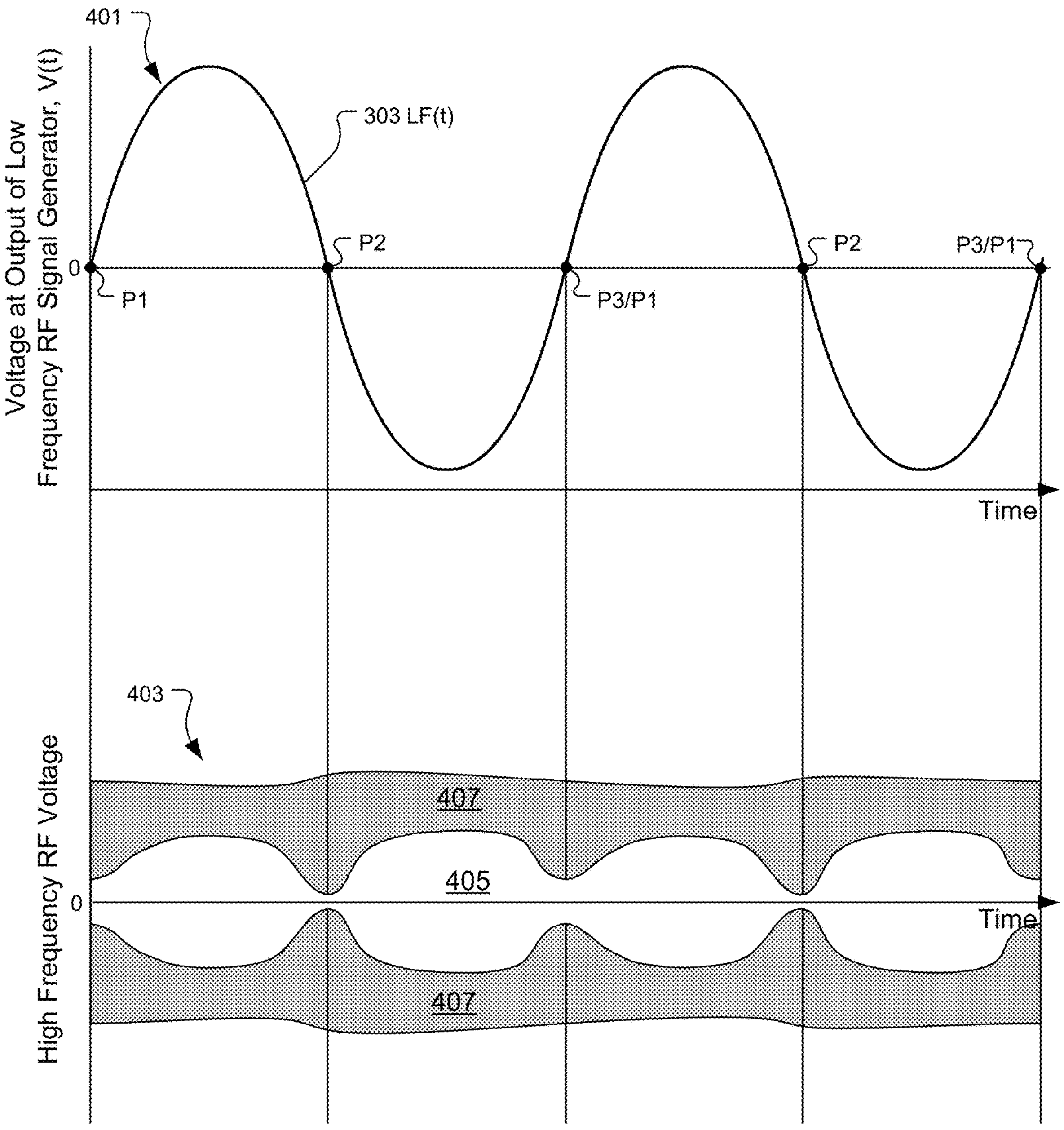
FIG. 4 shows plots of forward and reflected RF voltages proportional to delivered high frequency RF power and reflected high frequency RF power at an output of the of the high frequency RF signal generator, relative to a low frequency RF signal waveform at an output of the low frequency RF signal generator, in accordance with some embodiments.

FIG. 4 shows plots of forward high frequency RF voltage and reflected high frequency RF voltage at the output of the 271 of the high frequency RF signal generator 202, relative to the low frequency RF signal waveform at the output 210 of the low frequency RF signal generator 201, in accordance with some embodiments. The plots of FIG. 4 correspond to operation of the low frequency RF signal generator 201 and the high frequency RF signal generator 202 in accordance with the above-described frequency tuning process to generate a plasma for etching an oxide film from a silicon wafer. FIG. 4 includes an upper plot 401 that shows the curve 303 of voltage measured as a function of time at the output 210 of the low frequency RF signal generator 201, as previously described with regard to FIG. 3. The curve 303 represents the low frequency signal generated by the low frequency RF signal generator 201. FIG. 4 also includes a lower plot 403 that shows reflected RF voltage 405 as a function of time as measured at the output 271 of the high frequency RF signal generator 202. The reflected RF voltage 405 is the white region in the lower plot 403. The lower plot 403 also shows forward RF voltage 407 as a function of time. The forward RF voltage 407 is the gray region in the lower plot 403.

Figure 5:
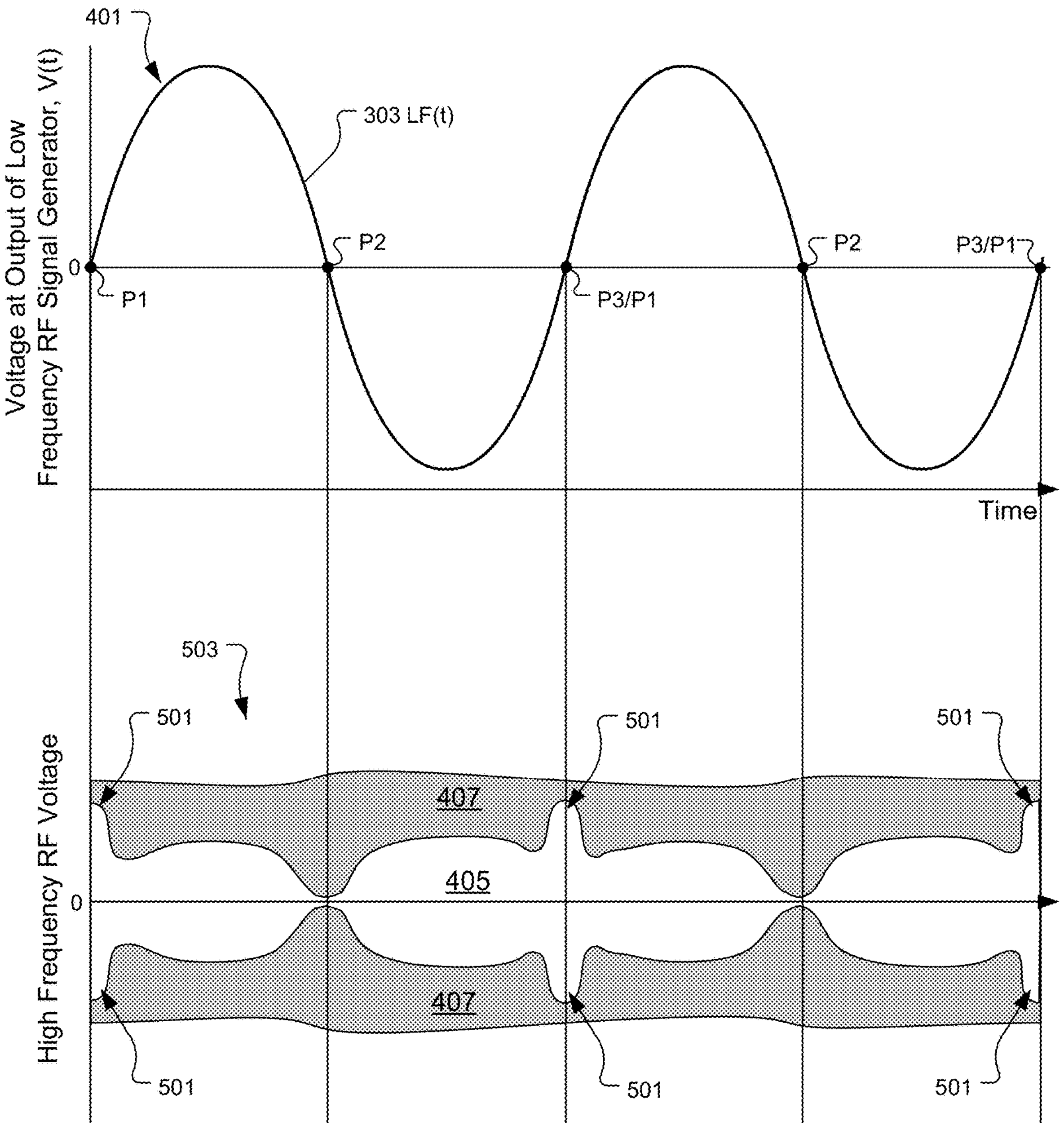
FIG. 5 shows the same plots as FIG. 4 at a point in time when an etch front passes through an oxide layer to reach an underlying silicon wafer, in accordance with some embodiments.

A change in impedance along the high frequency RF signal transmission path will manifest as a change in the reflected RF voltage 405 as a function of time as measured at the output 271 of the high frequency RF signal generator 202. Because the frequency tuning process is defined to minimize the reflected RF power, a significant enough change in impedance along the high frequency RF signal transmission path will cause the system to get out of tune, which will cause a corresponding detectable increase in the reflected RF voltage 405 at the output 271 of the high frequency RF signal generator 202. The change in impedance along the high frequency RF signal transmission path can be indicative of a meaningful condition and/or event in the plasma process and/or the plasma processing system 100A/100B. Therefore, detection of a change in the reflected RF voltage 405 as a function of time as measured at the output 271 of the high frequency RF signal generator 202 can be used as an indicator of a meaningful condition and/or event in the plasma process and/or plasma processing system 100A/100B. For example, FIG. 5 shows the same plots as FIG. 4 at a point in time when an etch front passes through the oxide layer to reach the underlying silicon wafer, in accordance with some embodiments. In FIG. 5, a noticeable and detectable change in the reflected RF voltage 405 as a function of time as measured at the output 271 of the high frequency RF signal generator 202 occurs. Specifically, at or near the time of the positive direction zero voltage crossing of the low frequency RF signal (points P1/P3), the reflected RF voltage 405 of the high frequency RF signal has a perturbation 501, when compared with the plot of FIG. 4 that corresponds to the etch front moving through the oxide film. The perturbation 501 indicates that a change in impedance as occurred along the high frequency RF signal transmission path. In some embodiments, a change in impedance of the plasma will affect harmonics of the high frequency RF signal, which can manifest as a change in the reflected RF power. In this example, the change in impedance indicated by the perturbation 501 is caused by a change in composition of the plasma, which was caused by the etch front moving from the oxide film layer into the underlying silicon wafer. Therefore, in this example, the perturbation 501 in the reflected RF voltage 405 of the high frequency RF signal is indicative of an endpoint condition for removing the oxide layer from the silicon wafer. In some embodiments, the control module 163 is programmed to automatically direct stoppage of the etching process upon detection of the perturbation 501 signature within the reflected RF voltage 405 as measured at the output 271 of the high frequency RF signal generator 202. It should be noted that a change in impedance along the high frequency RF signal transmission path caused by a change in composition of the plasma will manifest most prominently at or near the temporal location of the positive direction zero voltage crossing of the low frequency RF signal as generated by the low frequency RF signal generator 201. Therefore, a change in impedance of the plasma can be detected by monitoring the temporal bin (of the plurality of temporal bins B1 through B(N)) that corresponds to the positive direction zero voltage crossing of the low frequency RF signal as generated by the low frequency RF signal generator 201.

It should be understood that removal of an oxide layer from a silicon wafer is used herein for exemplary purposes. In many other embodiments, various types of perturbations in the reflected RF voltage 405 of the high frequency RF signal are indicative of various types of impedance changes along the high frequency RF signal transmission path, which are in turn indicative of various meaningful conditions and/or events in the plasma process and/or plasma processing system 100A/100B. For example, in some embodiments, a perturbation in the reflected RF voltage 405 of the high frequency RF signal is indicative of an etch front moving from one material to another on the substrate, which may or may not correspond to an endpoint condition, and can be used as a feedback signal for process control purposes. For example, upon detection of the perturbation in the reflected RF voltage 405 of the high frequency RF signal (as measured at the output 271 of the high frequency RF signal generator 202) that indicates movement of the etch front from one material to another on the substrate, the control mode 163 is programmed to adjust a process gas composition and/or RF power supply parameter for a next step of the plasma processing recipe.

Figure 6:
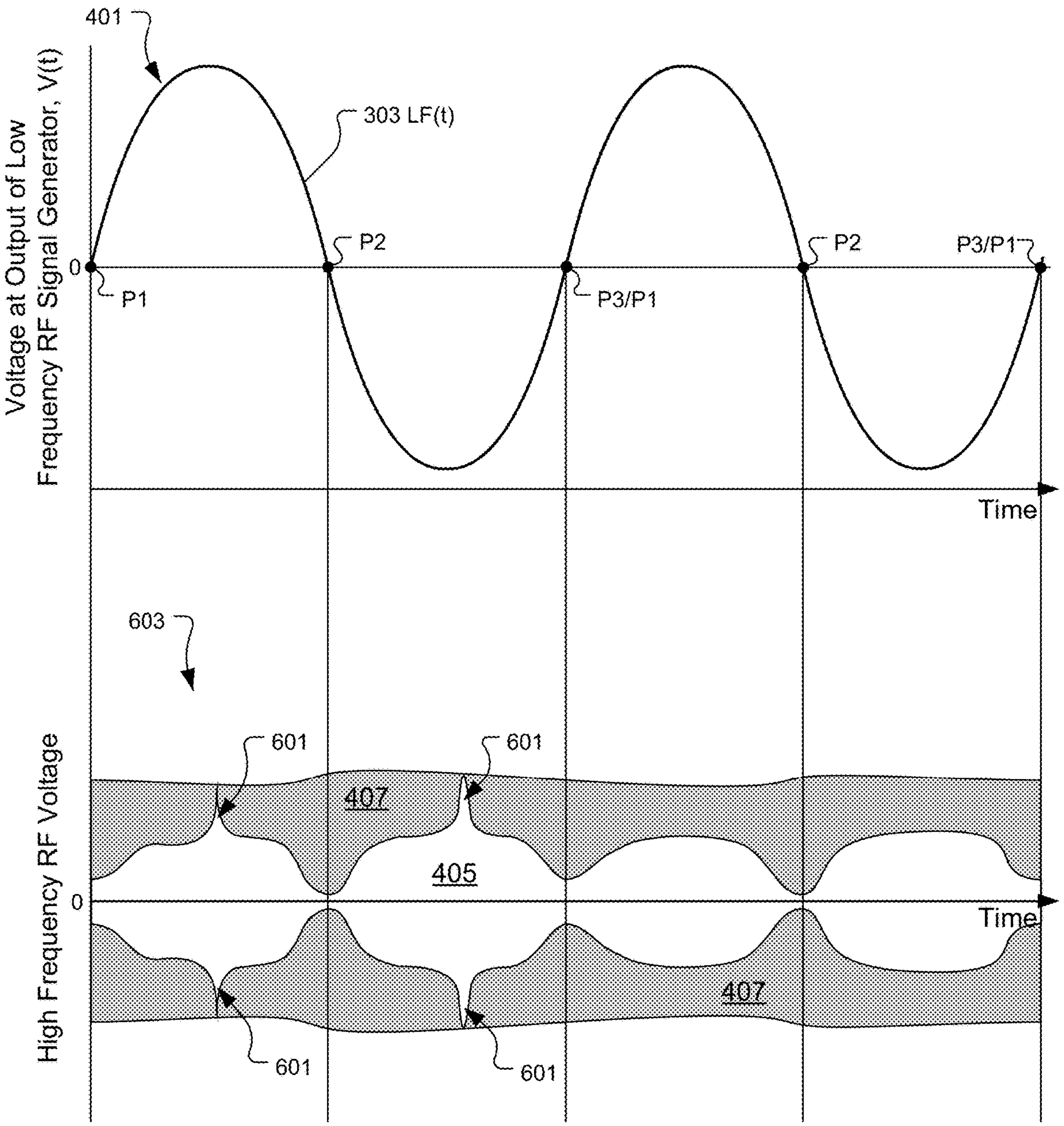
FIG. 6 shows the same plots as FIG. 4 at a point in time when an arcing event occurs within a plasma processing system, in accordance with some embodiments.

Also, in some embodiments, a perturbation in the reflected RF voltage 405 of the high frequency RF signal that is rapid and transitory is indicative of an arcing event within the plasma processing system. Such arcing events can be dangerous for both the substrate under manufacture and the plasma processing system. Therefore, it is advantageous to be able to detect the arcing event by monitoring for perturbations in the reflected RF voltage 450 of the high frequency RF signal. FIG. 6 shows the same plots as FIG. 4 at a point in time when an arcing event occurs within the plasma processing system 100A/100B, in accordance with some embodiments. In FIG. 6, a noticeable and detectable change in the reflected RF voltage 405 as a function of time as measured at the output 271 of the high frequency RF signal generator 202 manifests as a perturbation 601 indicative of an arcing event. The perturbation is characterized as being rapid and transient. For example, in some embodiments, the perturbation 601 that indicates occurrence of an arcing event will appear and go away within one cycle of the low frequency signal as generated by the low frequency RF signal generator 201. The duration of an arcing event is usually very small, on the order of tens of nanoseconds, which is much shorter than the duration of the complete cycle of the low frequency signal. In some embodiments, the control module 163 is programmed to analyze reflected RF power data as measured at the output 271 of the high frequency RF signal generator 202 to identify occurrence of the perturbation 601 that is indicative of the arcing event. In some embodiments, the control module 163 is programmed to direct automatic shutdown of the plasma process upon detecting the perturbation 601 that is indicative of the arcing event.

In some embodiments, a change in the reflected RF voltage 405 of the high frequency RF signal that is slow and persistent, e.g., that exists in a consistent manner over multiple plasma processing operations, is indicative of a change in chamber condition within the plasma processing system, such as byproduct buildup on surfaces within the plasma processing system. This slow and persistent change in the reflected RF voltage 405 of the high frequency RF signal is detectable by the control module 163, which in turn is programmed to send an alert. Additionally, in some embodiments, a change in the reflected RF voltage 405 of the high frequency RF signal can be used to detect completion of a waferless auto clean (WAC) process on the plasma processing system. For example, a non-optimal and/or unstable signature can exist in the reflected RF voltage 405 of the high frequency RF signal until the WAC reaches endpoint and the condition of surfaces within the plasma processing system are essentially constant/clean, at which point the reflected RF voltage 405 of the high frequency RF signal will stabilize.

In some embodiments, the frequency tuning process causes an automatic change in operating frequency of the high frequency RF signal generator 202 to mitigate the adverse perturbation 501 in the reflected RF voltage 405 of the high frequency RF signal. In these embodiments, the automatic change in operating frequency of the high frequency RF signal generator 202 can be used as an indicator of the presence of the adverse perturbation in the reflected high frequency RF power. In some embodiments, the control module 163 is programmed to either directly detect the perturbation in the reflected high frequency RF power at the output 271 of the high frequency RF signal generator 202, or indirectly detect the perturbation in the reflected high frequency RF power by detecting the automatic change in operating frequency of the high frequency RF signal generator 202 that corresponds to the frequency tuning process attempting to mitigate the perturbation in the reflected high frequency RF power.

In accordance with the foregoing, the RF signal generator system 200 for the plasma processing system 100A/100B is disclosed herein. The RF signal generator system 200 includes the low frequency RF signal generator 201 (a first RF signal generator) set to generate a low frequency signal at the output 210 of the low frequency RF signal generator 201. The RF signal generator system 200 also includes the high frequency RF signal generator 202 (a second RF signal generator) set to generate a high frequency signal at the output 271 of the high frequency RF signal generator 202. The RF signal generator system 200 also includes the impedance matching system 215 having the first input 217 connected to the output 210 of the low frequency RF signal generator 201, and having the second input 275 connected to the output 271 of the high frequency RF signal generator 202. The impedance matching system 215 has the output 223 connected to a radiofrequency supply input (the RF feed structure 109) of the plasma processing system 100A/100B. The impedance matching system 215 is configured to control impedances at the output 210 of the low frequency RF signal generator 201 and at the output 271 of the high frequency RF signal generator 202. The RF signal generator system 200 also includes the control module 163 programmed to monitor a reflected voltage at the output 271 of the high frequency RF signal generator 202. The control module 163 is programmed to determine when the reflected voltage at the output 271 of the high frequency RF signal generator indicates a change in impedance along a transmission path of the high frequency signal that is indicative of a particular process condition and/or event. In some embodiments, the control system 281 of the high frequency RF signal generator 202 is programmed to monitor the reflected voltage at the output 271 of the high frequency RF signal generator 202, and determine when the reflected voltage at the output 271 of the high frequency RF signal generator indicates a change in impedance along a transmission path of the high frequency signal that is indicative of a particular process condition and/or event.

In some embodiments, the control module 163 (control system 281) is programmed to correlate a rapid and persistent change in reflected voltage at the output 271 of the high frequency RF signal generator 202 to a change in impedance of a plasma generated by the low frequency signal and the high frequency signal. In some embodiments, the control module 163 (or control system 281) is programmed to signal an endpoint of a plasma process upon correlation of the rapid and persistent change in reflected voltage at the output 271 of the high frequency RF signal generator 202 to the change in impedance of the plasma. In some embodiments, the plasma process is an etching process. In some embodiments, the control module 163 (or control system 281) is programmed to signal a transition within a plasma process upon correlation of the rapid and persistent change in reflected voltage at the output 271 of the high frequency RF signal generator 202 to the change in impedance of the plasma. In some embodiments, the transition within the plasma process is exposure of a particular material on a substrate to the plasma.

In some embodiments, the control module 163 (or control system 281) is programmed to correlate a rapid and transitory change in reflected voltage at the output 271 of the high frequency RF signal generator 202 to an arcing event. Also, in these embodiments, the control module 163 (or control system 281) is programmed to signal detection of the arcing event. In some embodiments, the control module 163 (or control system 281) is programmed to correlate a slow and persistent change in reflected voltage at the output 271 of the high frequency RF signal generator 202 to a change in a condition of the plasma processing system 100A/100B. In these embodiments, the control module 163 (or control system 281) is programmed to signal detection of the change in the condition of the plasma processing system 100A/

100B. In some embodiments, the change in the condition of the plasma processing system 100A/100B is a build-up of byproduct material on one or more surfaces within the plasma processing system 100A/100B.

In some embodiments, the control module 163 (or control system 281) is programmed to correlate a rapid and persistent change in reflected voltage at the output 271 of the high frequency RF signal generator 202 to an endpoint of waferless auto-clean process performed on the plasma processing system 100A/100B. In some embodiments, the control module 163 (or control system 281) is programmed to compare the reflected voltage at the output 271 of the high frequency signal generator 202 to one or more of a plurality of stored reflected voltage signatures, e.g., waveforms, respectively associated with a plurality of conditions and/or events to determine whether a corresponding condition/event has occurred. Also, in these embodiments, the control module 163 (or control system 281) is programmed to signal occurrence of the corresponding condition/event.

In some embodiments, the control module 163 (or combination of control system 209 and control system 281) is programmed to direct operation of the low frequency RF signal generator 201 and the high frequency RF signal generator 202 in accordance with the frequency tuning process. The frequency tuning process automatically adjusts an operating frequency of the low frequency RF signal generator 201 about a target frequency of the low frequency signal to minimize reflected voltage at the output 210 of the low frequency RF signal generator 201. Also, the frequency tuning process automatically adjusts an operating frequency of the high frequency RF signal generator 202 about a target frequency of the high frequency signal to minimize reflected voltage at the output 271 of the high frequency RF signal generator 202. The operating frequency of the high frequency RF signal generator 202 is separately adjusted about the target frequency of the high frequency signal in each of the plurality of temporal bins B1 through B(N) that collectively span a complete cycle of the low frequency signal generated by the low frequency RF signal generator 201. The plurality of temporal bins B1 through B(N) and corresponding separate operating frequency adjustments of the high frequency RF signal generator 202 repeat in sequence over each cycle of the low frequency signal generated by the low frequency RF signal generator 201.

In some embodiments, the first temporal bin B1 of the plurality of temporal bins B1 through B(N) begins at a positive direction zero voltage crossing of the complete cycle of the low frequency signal as generated by the low frequency RF signal generator 201. Also, the last temporal bin B(N) of the plurality of temporal bins B1 through B(N) ends at the positive direction zero voltage crossing of the complete cycle of the low frequency signal as generated by the low frequency RF signal generator 201. In some embodiments, the operating frequency of the high frequency RF signal generator 202 is set at an adjusted frequency in each of the plurality of temporal bins B1 through B(N). The adjusted frequency in any given one of the plurality of temporal bins B1 through B(N) is independently and separately set relative to others of the plurality of temporal bins B1 through B(N). In some embodiments, the adjusted frequency of a given one of the plurality of temporal bins B1 through B(N) is an integer multiple of the frequency adjustment amount ($f_{adj}$) about the target frequency (HF0) of the high frequency signal as generated by the high frequency RF signal generator 202. In some embodiments, the integer multiple is either −4, −3, −2, −1, 0, +1, +2, +3, +4, and the frequency adjustment amount ($f_{adj}$) is a target frequency of the low frequency signal generated by the low frequency RF signal generator 201. In some embodiments, the control module 163 (or control system 281) is programmed to correlate a rapid and persistent change in reflected voltage at the output 271 of the high frequency RF signal generator 202 that occurs at the positive direction zero voltage crossing of the complete cycle of the low frequency signal to a change in impedance of a plasma generated by the low frequency signal and the high frequency signal.

Figure 7:
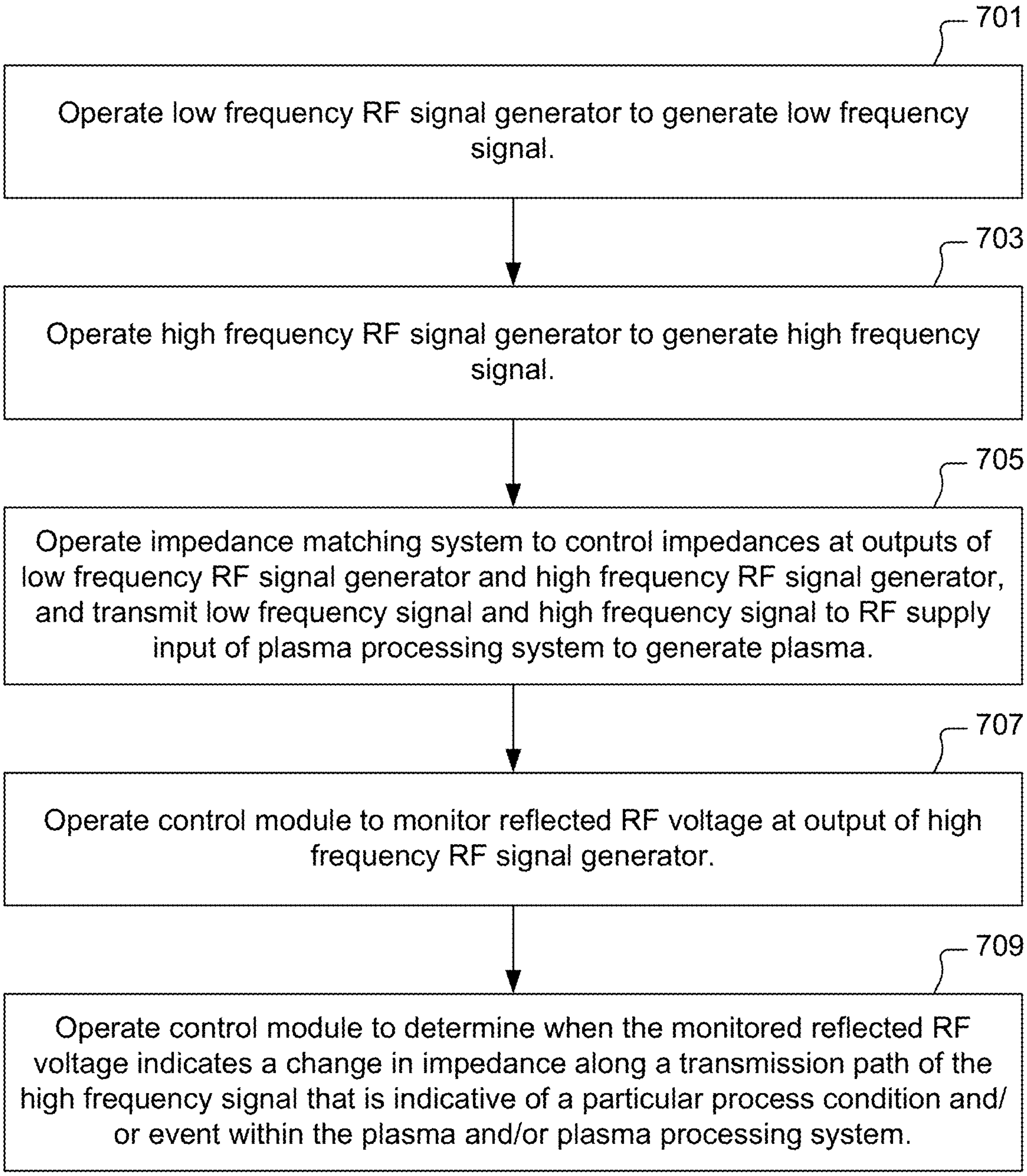
FIG. 7 shows a flowchart of a method for operating an RF signal generator system for a plasma processing system, in accordance with some embodiments.

FIG. 7 shows a flowchart of a method for operating the RF signal generator system 200 for the plasma processing system 100A/100B, in accordance with some embodiments. The method includes an operation 701 for operating the low frequency RF signal generator 201 (the first RF signal generator) to generate a low frequency signal at the output 210 of the low frequency RF signal generator. The method also includes an operation 703 for operating the high frequency RF signal generator 202 (the second RF signal generator) to generate a high frequency signal at the output 271 of the high frequency RF signal generator 202. The method also includes an operation 705 for operating the impedance matching system 215 to control impedances at the output 210 of the low frequency RF signal generator 201 and at the output 271 of the high frequency RF signal generator 202. The low frequency signal and the high frequency signal are transmitted through the impedance matching system 215 to a radiofrequency supply input of the plasma processing system 100A/100B causing generation of a plasma within the plasma processing system 100A/100B. The method further includes an operation 707 for operating the control module 163 (or control system 281) to monitor a reflected RF voltage at the output 271 of the high frequency RF signal generator 202. The method also includes an operation 709 for operating the control module 163 (or control system 281) to determine when the reflected RF voltage at the output 271 of the high frequency RF signal generator 202 indicates a change in impedance along a transmission path of the high frequency signal that is indicative of a particular process condition and/or event within the plasma and/or plasma processing system 100A/100B.

In some embodiments, the method includes identifying a change in impedance of the plasma by detecting a rapid and persistent change in reflected RF voltage at the output 271 of the high frequency RF signal generator 202. In some embodiments, the method includes signaling an endpoint of a plasma process upon identifying the change in impedance of the plasma. In some embodiments, the plasma process is an etching process. In some embodiments, the method includes signaling a transition within a plasma process upon identifying the change in impedance of the plasma. In some embodiments, the transition within the plasma process is exposure of a particular material on a substrate to the plasma. In some embodiments, the method includes identifying an arcing event within the plasma processing system 100A/100B by detecting a rapid and transitory change in reflected RF power at the output 271 of the high frequency RF signal generator 202. Also, in these embodiments, the method includes signaling identification of the arcing event. In some embodiments, the method includes identifying a change in a condition of the plasma processing system 100A/100B by detecting a slow and persistent change in reflected RF power at the output 271 of the high frequency RF signal generator 201. In these embodiments, the method includes signaling detection of the change in the condition of the plasma processing system 100A/100B. In some embodiments, the change in the condition of the plasma processing system 100A/100B is a build-up of byproduct material on one or more surfaces within the plasma processing system 100A/100B.

In some embodiments, the method includes performing a waferless auto clean process on the plasma processing system 100A/100B, and stopping the waferless auto clean process upon detection of a rapid and persistent change in reflected RF power at the output 271 of the high frequency RF signal generator 202. In some embodiments, the method includes identifying occurrence of a particular condition/event within the plasma processing system 100A/100B by comparing the reflected RF voltage at the output 271 of the high frequency RF signal generator 202 to stored reflected RF voltage signatures, e.g., waveforms, respectively associated with different conditions and/or events within the plasma and/or plasma processing system. Also, in these embodiments, the method includes signaling occurrence of the particular condition/event.

In some embodiments, the method includes operating the low frequency RF signal generator 201 and the high frequency RF signal generator 202 in accordance with a frequency tuning process. The frequency tuning process automatically adjusts an operating frequency of the low frequency RF signal generator 201 about a target frequency of the low frequency signal to minimize reflected RF voltage at the output 210 of the low frequency RF signal generator 201. The frequency tuning process also automatically adjusts an operating frequency of the high frequency RF signal generator 202 about a target frequency of the high frequency signal to minimize reflected RF voltage at the output 271 of the high frequency RF signal generator 202. The operating frequency of the high frequency RF signal generator 202 is separately adjusted about the target frequency of the high frequency signal in each of the plurality of temporal bins B1 through B(N) that collectively span a complete cycle of the low frequency signal generated by the low frequency RF signal generator 201. The plurality of temporal bins B1 through B(N) and corresponding separate operating frequency adjustments of the high frequency RF signal generator 202 repeat in sequence over each cycle of the low frequency signal generated by the low frequency RF signal generator 201.

In some embodiments, the first temporal bin B1 of the plurality of temporal bins B1 through B(N) begins at a positive direction zero voltage crossing of the complete cycle of the low frequency signal as generated by the low frequency RF signal generator 201. And, the last temporal bin B(N) of the plurality of temporal bins B1 through B(N) ends at the positive direction zero voltage crossing of the complete cycle of the low frequency signal as generated by the low frequency RF signal generator 201. In some embodiments, the method includes setting the operating frequency of the high frequency RF signal generator 202 at an adjusted frequency in each of the plurality of temporal bins B1 through B(N). The adjusted frequency in any given one of the plurality of temporal bins B1 through B(N) is independently and separately set relative to others of the plurality of temporal bins B1 through B(N). In some embodiments, the adjusted frequency of a given one of the plurality of temporal bins B1 through B(N) is an integer multiple of the frequency adjustment amount ($f_{adj}$) about the target frequency (HF0) of the high frequency signal as generated by the high frequency RF signal generator 202. In some embodiments, the integer multiple is either −4, −3, −2, −1, 0, +1, +2, +3, +4, and the frequency adjustment amount ($f_{adj}$) is a target frequency of the low frequency signal generated by the low frequency RF signal generator 201. In some embodiments, the method includes identifying a change in impedance of the plasma by detecting occurrence of a rapid and persistent change in reflected RF voltage at the output 271 of the high frequency RF signal generator 202 at the temporal bin B1 corresponding to the positive direction zero voltage crossing of the complete cycle of the low frequency signal as generated by the low frequency RF signal generator 201.

It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for operating a radiofrequency signal generator system for a plasma processing system, comprising:

operating a first radiofrequency signal generator to generate a low frequency signal at an output of the first radiofrequency signal generator;

operating a second radiofrequency signal generator to generate a high frequency signal at an output of the second radiofrequency signal generator;

operating an impedance matching system to control impedances at the output of the first radiofrequency signal generator and at the output of the second radiofrequency signal generator, the low frequency signal and the high frequency signal transmitted through the impedance matching system to a radiofrequency supply input of the plasma processing system causing generation of a plasma within the plasma processing system;

operating a control module to monitor a reflected power at the output of the second radiofrequency signal generator; and operating the control module to determine when the reflected power at the output of the second radiofrequency signal generator indicates a change in impedance along a transmission path of the high frequency signal that is indicative of a particular process condition and/or event within the plasma processing system.

2. The method as recited in claim 1, further comprising: identifying a change in impedance of the plasma by detecting a rapid and persistent change in reflected power at the output of the second radiofrequency signal generator.

3. The method as recited in claim 2, further comprising: signaling an endpoint of a plasma process upon identifying the change in impedance of the plasma.

4. The method as recited in claim 3, wherein the plasma process is an etching process.

5. The method as recited in claim 2, further comprising: signaling a transition within a plasma process upon identifying the change in impedance of the plasma.

6. The method as recited in claim 5, wherein the transition within the plasma process is exposure of a particular material on a substrate to the plasma.

7. The method as recited in claim 1, further comprising:

identifying an arcing event within the plasma processing system by detecting a rapid and transitory change in reflected power at the output of the second radiofrequency signal generator; and signaling identification of the arcing event.

8. The method as recited in claim 1, further comprising:

identifying a change in a condition of the plasma processing system by detecting a slow and persistent change in reflected power at the output of the second radiofrequency signal generator; and signaling detection of the change in the condition of the plasma processing system.

9. The method as recited in claim 8, wherein the change in the condition of the plasma processing system is a build-up of byproduct material on one or more surfaces within the plasma processing system.

10. The method as recited in claim 1, further comprising:

performing a waferless auto-clean process on the plasma processing system; and stopping the waferless auto-clean process upon detection of a rapid and persistent change in reflected power at the output of the second radiofrequency signal generator.

11. The method as recited in claim 1, further comprising:

identifying occurrence of a particular condition/event within the plasma processing system by comparing the reflected power at the output of the second radiofrequency signal generator to stored reflected power signatures respectively associated with different conditions and/or events; and signaling occurrence of the particular condition/event.

12. The method as recited in claim 1, further comprising:

operating the first radiofrequency signal generator and the second radiofrequency signal generator in accordance with a frequency tuning process, wherein the frequency tuning process automatically adjusts an operating frequency of the first radiofrequency signal generator about a target frequency of the low frequency signal to minimize reflected power at the output of the first radiofrequency signal generator, and wherein the frequency tuning process automatically adjusts an operating frequency of the second radiofrequency signal generator about a target frequency of the high frequency signal to minimize reflected power at the output of the second radiofrequency signal generator, wherein the operating frequency of the second radiofrequency signal generator is separately adjusted about the target frequency of the high frequency signal in each of a plurality of temporal bins that collectively span a complete cycle of the low frequency signal generated by the first radiofrequency signal generator, with the plurality of temporal bins and corresponding separate operating frequency adjustments repeating in sequence over each cycle of the low frequency signal generated by the first radiofrequency signal generator.

13. The method as recited in claim 12, wherein a first temporal bin of the plurality of temporal bins begins at a positive direction zero voltage crossing of the complete cycle of the low frequency signal, and wherein a last temporal bin of the plurality of temporal bins ends at the positive direction zero voltage crossing of the complete cycle of the low frequency signal.

14. The method as recited in claim 12, further comprising:

setting the operating frequency of the second radiofrequency signal generator at an adjusted frequency in each of the plurality of temporal bins, wherein the adjusted frequency in any given one of the plurality of temporal bins is independently and separately set relative to others of the plurality of temporal bins.

15. The method as recited in claim 14, wherein the adjusted frequency of a given one of the plurality of temporal bins is an integer multiple of a frequency adjustment amount about the target frequency of the high frequency signal.

16. The method as recited in claim 15, wherein the integer multiple is either −4, −3, −2, −1, 0, +1, +2, +3, +4, and wherein the frequency adjustment amount is a target frequency of the low frequency signal generated by the first radiofrequency signal generator.

17. The method as recited in claim 16, further comprising:

identifying a change in impedance of the plasma by detecting occurrence of a rapid and persistent change in reflected power at the output of the second radiofrequency signal generator within a first temporal bin of the plurality of temporal bins that begins at a positive direction zero voltage crossing of the complete cycle of the low frequency signal.

* * * * *